United States Patent [19]

Tanaka et al.

[11] Patent Number: 4,959,279
[45] Date of Patent: Sep. 25, 1990

[54] SUPERCONDUCTING WIRE CONTAINING MULTIFILAMENTARY SUPERCONDUCTING ALLOY

[75] Inventors: Yasuzo Tanaka; Kaname Matsumoto, both of Yokohama; Yukio Yamada, Kanagawa, all of Japan

[73] Assignee: The Furukawa Electric Co., Ltd., Tokyo, Japan

[21] Appl. No.: 297,949

[22] Filed: Jan. 17, 1989

[51] Int. Cl.⁵ .................. H01L 39/24; B32B 15/00
[52] U.S. Cl. ...................... 428/660; 29/599; 148/901; 428/614; 428/930
[58] Field of Search ............ 428/614, 930, 660; 29/599; 148/901

[56] References Cited

U.S. PATENT DOCUMENTS

| | | | |
|---|---|---|---|
| 3,710,000 | 1/1973 | Shattes et al. | 29/599 |
| 4,103,075 | 7/1978 | Adam | 428/614 |
| 4,242,536 | 12/1980 | Young | 29/599 |
| 4,262,412 | 4/1981 | McDonald | 428/609 |
| 4,427,746 | 1/1984 | Takamura | 428/614 |
| 4,508,578 | 4/1985 | Wada et al. | 29/599 |
| 4,723,355 | 2/1988 | Both et al. | 29/599 |
| 4,757,161 | 7/1988 | Wilhelm et al. | 29/599 |

OTHER PUBLICATIONS

Appl. Phys. Letts. 25 (1974) 94.

Primary Examiner—Upendra Roy
Attorney, Agent, or Firm—Frishauf, Holtz, Goodman & Woodward

[57] ABSTRACT

A superconducting wire containing a multifilamentary superconducting alloy, comprising at least one composite containing a first matrix in which a plurality of superconducting alloy filaments have been arranged and a second matrix in which at least one composite is embedded; wherein said first matrix consists essentially of a metal or an alloy which does not form any intermetallic compound with the superconducting alloy filament. As the superconducting alloy filament, a Nb-Ti alloy filament may preferably be selected; the first matrix may preferably consist of one selected from the group of Nb, Ta and a Nb-Ta alloy; and the second matrix may preferably consist of Cu, A Cu-Ni alloy, Al, or an Al alloy.

8 Claims, 1 Drawing Sheet

SUPERCONDUCTING WIRE CONTAINING MULTIFILAMENTARY SUPERCONDUCTING ALLOY

BACKGROUND OF THE INVENTION

This invention relates to a superconducting wire containing a multifilamentary superconducting alloy.

A multifilamentary Nb-Ti alloy superconducting wire made by distributing a multiplicity of Nb-Ti alloy filaments through a matrix comprising Cu or a Cu-Ni alloy is disclosed in, for example, "Multifilamentary Superconducting Composites" (CRYOGENICS, pp. 3–10, Feb. 1971, P.R. Critchlow et al.), as one type of the superconducting wire containing a multifilamentary superconducting alloy.

Such multifilamentary Nb-Ti alloy superconducting wire, as shown in FIG. 3 in cross sections, has a structure in which a plurality of Nb-Ti alloy filaments 1 are distributed through a matrix 2, forming a structure of composite as a whole. In this structure, Cu or a Cu-Ni alloy is used as the material for the matrix 2.

Such multifilamentary Nb-Ti alloy superconducting wire is manufactured by drilling a plurality of holes through a rod comprising a matrix material and inserting rods comprising a Nb-Ti alloy into the holes, followed by drawing of the entire rod composite under heating to allow it to have a smaller diameter, and repeating the above drawing operation using the resulting rod composite to allow it to have smaller diameter step by step, such that the rods contained in the rod may be finally formed into thin filaments.

In the above conventional method, however, there is a problem that a filament having a high critical current density cannot be obtained because the core material of Nb-Ti alloy and the the matrix of Cu or Cu-Ni alloy are brought into direct contact with each other which are drawn under heating in such state, so that in this process, an intermetallic compound shown by "$Cu_xTi_y$" ("x" and "y" each represent an index showing the number of reacted mole number) is formed along the interface between the core material and the matrix, causing constrictions in the resulting Nb-Ti alloy filament or disconnections in the filament during the drawing process.

moreover, if the formation of "$Cu_xTi_y$" along the interface between the core material of Nb-Ti alloy and the matrix is intended to be inhibited by using a reduced number of hot wire drawing to be repeated, in order to obviate the above problem, there is another problem that a wire having a large current capacity can hardly be obtained since the number of the Nb-Ti alloy filaments is restricted as the result of the failure in reducing the diameter of the filaments, and thus the Nb-Ti alloy filaments come to have a low critical current density.

This problem is commonly found in such cases where the intermetallic compound is formed between the core material of superconducting alloy and the matrix in which the core material is distributed, cuasing constriction or disconnection in the filaments during the process of drawing, when superconducting wires are generally made by burying a core material of superconducting alloy in a matrix.

OBJECTS AND SUMMARY OF THE INVENTION

One object of this invention is to provide a superconducting wire containing a multifilamentary superconducting alloy having no intermetallic compound such as "$Cu_xTi_y$" to be formed between the core material of superconducting alloy and the matrix which may cause constriction or disconnection in the filaments.

Another object of this invention is to provide a superconducting wire containing a multifilamentary superconducting alloy which contains a multiplicity of thin superconducting filaments without causing any constriction or disconnection in the filaments during the process of hot wire drawing.

A further object of this invention is to provide a superconducting wire containing a multifilamentary superconducting alloy, having a high critical current density.

According to this invention, there is provided a superconducting wire containing a multifilamentary superconducting alloy having a multiplicity of superconducting alloy filaments and a first matrix in which the filaments are arranged. In the superconducting wire of this invention, at least one composite comprising the first matrix in which a plurality of superconducting alloy filaments have been arranged is embedded in a second matrix, wherein the first matrix consists of a metal or an alloy which does not form any intermetallic compound with the filament which is the core material.

Preferably, the superconducting filament comprises a Ni-Ti alloy filament; and the first matrix consists essentially of one selected from the group of Nb and Ta, or a Nb-Ta alloy; whereas the second matrix comprises Cu, a Cu-Ni alloy, Al, or an Al alloy.

Further objects and effects of this invention will further be clarified by the following embodiments and the attached drawings.

DETAILED DESCRIPTION

Figure 1:
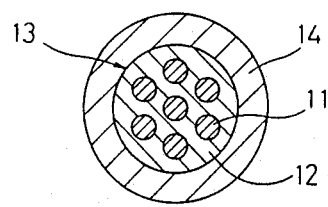
FIG. 1 shows one embodiment of this invention illustrating a multifilamentary Nb-Ti alloy superconducting wire in cross-section.

In the embodiment shown in FIG. 1, shown is a superconducting wire made by burying a composite 13, which had been made by burying a plurality of Nb-Ti alloy filaments 11 which characteristically exhibit superconductivity in a first matrix 12 comprising Nb, Ta or a Nb-Ta alloy, in a second matrix 14.

In this embodiment, the material of the outer second matrix 14 may not particularly be limited and may be any of Cu or Al having a low electric resistance, or a Cu-Ni alloy or an Al alloy having a relatively high electric resistance, which are conventionally used.

In this structure, no intermetallic compound such as "$Cu_xTi_y$" is formed along the interface between the plurality of superconducting Nb-Ti alloy filaments and the second matrix 14 because they may not be brought into direct contact with each other since the first matrix 12 is interposed therebetween. Therefore, a filament which is thin compared with the Nb-Ti alloy filament can be made by repeating the hot wire drawing many times for achieving reduction of diameter.

Figure 2:
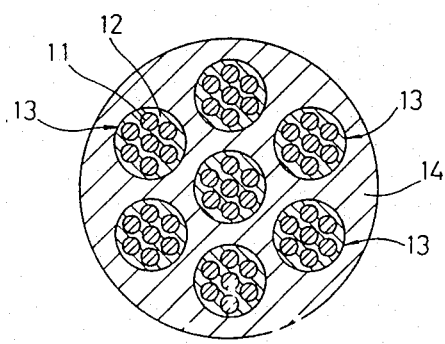
FIG. 2 shows another embodiment of this invention illustrating a Nb-Ti alloy multifilamentary superconducting wire in cross-section.
Figure 3:
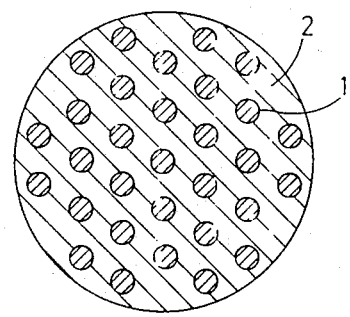
FIG. 3 shows, in cross-section, a constitution of a conventional multifilamentary Nb-Ti alloy superconducting wire.

In the second embodiment shown in FIG. 2 shown is a composite superconducting wire made by burying a plurality of composites 13 shown in FIG. 1 in the second matrix 14.

Also in this embodiment, no "$Cu_xTi_y$" and the like is formed along the interface because the Nb-Ti alloy filaments 11 may not be brought into direct contact with the second matrix 14. Further, since the composites 13 can be made thinner than the conventional one as mentioned above, the resulting surperconducting wire can contain a greater number of filaments 11 than in the conventional wire, although the wire may have the same cross-sectional area as the conventional wire. As a result, a superconducting wire having a large current capacity compared with the conventional wire can be obtained.

EXAMPLES

Example 1

As shown in FIG. 2, a composite rod 13 was made by drilling seven 8.1 mm-diameter holes through a 35 mm-diameter Nb rod 12 inserting an 8.0 mm-diameter Nb-50% Ti alloy wire 11 into the respective holes. Subsequently, seven composite rods 13 thus obtained were sealed in a cupro-nickel tube 14 having an inner diameter of 35.1 mm and an outer diameter of 45 mm, and the entire tube composite was subjected to hot extrusion at a temperature of 900° C., followed by cold working and intermediate heat treatment to provide a multifilamentary Nb-Ti alloy (49 filaments) superconducting wire having a diameter of 0.1 mm.

Control 1

Seven 8.1 mm-diameter holes were drilled through a cupro-nickel rod having an outer diameter of 45 mm, and an 8 mm-diameter Nb-50% Ti alloy rod was inserted into the respective holes, followed by sealing of the both ends of the entire composite rod. Then, similarly to Example 1, wire drawing process was applied to the entire composite rod to make a 0.1 mm-diameter superconducting wire.

The cross-sections of the two superconducting wires prepared above were observed using a microscope to examine the cross-sectional shape or state of the Nb-Ti alloy filament and formation of any "$Cu_xTi_y$" along the interface between the filaments and the matrix. Also, the critical current density of each superconducting wire was measured at 5 T (T: Tesla). In addition, disconnection in the filaments which might have occurred during the wire drawing process was checked. The results are summarized in Table 1.

TABLE 1

|  | Example 1 | Control 1 |
| --- | --- | --- |
| Cross-sectional shape or state of Nb—Ti alloy filament | Uniform | Irregular |
| Formation of $Cu_xTi_y$ | None | Much |
| Disconnection in filament during drawing process | No disconnection occurred | Many occurred |
| Critical current density (at 5 T) | Jc = 2.5 × 10$^5$A/cm$^2$ | Jc = 1.5 × 10$^5$A/cm$^2$ |

Example 2

A composite rod was made by inserting a bundle of 19 Nb-45% Ti alloy rods into a Ta rod containing 2% Nb so that the weight ratio of Ta/Nb-Ti may be 1. A bundle of 270 composite rods as prepared above were inserted into a Cu tube having an outer diameter of 250 mm and an inner diameter of 225 mm, and the entire composite tube was extruded under heating at 850° C. to make a hexagonal rod having an opposite side of 25 mm. A bundle of 5,316 hexagonal rods as prepared above were inserted into a Cu tube having an outer diameter of 250 mm and an inner diameter of 225 mm and extruded under heating at a temperature of about 600° C., followed by cold wording and intermediate heat treatment, to make a 0.5 mm-diameter multifilamentary Nb-Ti alloy superconducting wire.

Control 2

A 0.5 mm-diameter superconducting wire was made in the same manner as in Example 2 except that a Cu rod was used instead of the Ta rod.

Various characteristics of the above two types of superconducting composites were determined similarly to Example 1 and Control 1. The rusults are shown in Table 2.

TABLE 2

|  | Example 2 | Control 2 |
| --- | --- | --- |
| Cross-sectional shape or state of alloy filament | Uniform | Irregular |
| Formation of $Cu_xTi_y$ | None | Much |
| Disconnection in filament during drawing process | No disconnection occurred | Many occurred |
| Critical current density (at 5 T) | Jc = 3 × 10$^5$A/cm$^2$ | Jc = 2 × 10$^5$A/cm$^2$ |

What is claimed is:

1. A superconducting wire containing a multifilamentary superconducting alloy, comprising:
    at least one composite containing a first matrix in which a plurality of superconducting alloy filaments are arranged, said plurality of superconducting alloy filaments extending parallel to one another in a longitudinal direction of said at least one composite; and
    a second matrix in which said at least one composite is embedded, said first matrix consisting essentially of a metal or an alloy which does not form any intermetallic compound with said superconducting alloy filament.

2. The superconducting wire according to claim 1, wherein said surpeconducting alloy filament comprises a Nb-Ti alloy filament and said first matrix consists essentially of one selected from the group of Nb, Ta, and Nb-Ta alloy.

3. The superconducting wire according to claim 1, wherein said second matrix consists essentially of Cu.

4. The superconducting wire according to claim 1, wherein said second matrix consists essentially of a Cu-Ni alloy.

5. The superconducting wire according to claim 1, wherein said second matrix consists essentially of Al or an Al alloy.

6. The superconducting wire according to claim 2, wherein said second matrix consists essentially of Cu.

7. The superconducting wire according to claim 2, wherein said second matrix consists essentially of a Cu-Ni alloy.

8. The superconducting wire according to claim 2, wherein said second matrix consists essentially of Al or an Al alloy.

* * * * *